United States Patent [19]

Mayer

[11] 4,376,581
[45] Mar. 15, 1983

[54] METHOD OF POSITIONING DISK-SHAPED WORKPIECES, PREFERABLY SEMICONDUCTOR WAFERS

[75] Inventor: Herbert E. Mayer, Eschen, Liechtenstein

[73] Assignee: Censor Patent- und Versuchs-Anstalt, Vaduz, Liechtenstein

[21] Appl. No.: 220,451

[22] Filed: Dec. 29, 1980

Related U.S. Application Data

[63] Continuation-in-part of Ser. No. 188,539, Sep. 18, 1980, abandoned.

[30] Foreign Application Priority Data

Dec. 20, 1979 [DE] Fed. Rep. of Germany ....... 2951454

[51] Int. Cl.³ .............................................. G03B 27/32
[52] U.S. Cl. ...................................... 355/77; 355/41; 355/43
[58] Field of Search ...................... 355/41, 43, 63, 73, 355/78, 79, 95, 132, 61, 62

[56] References Cited

U.S. PATENT DOCUMENTS

| | | | |
|---|---|---|---|
| 3,844,655 | 10/1974 | Johannsmeier | 355/43 |
| 3,930,684 | 1/1976 | Lasch, Jr. et al. | 350/73 X |
| 4,295,735 | 10/1981 | Lacombat et al. | 355/63 X |

Primary Examiner—Richard A. Wintercorn
Attorney, Agent, or Firm—Karl F. Ross

[57] ABSTRACT

In the photoexposure of semiconductor wafers for the production of circuit elements, the wafers are placed in a prealignment position before being transferred to the exposure stage. A chuck acting as a prepositioning stage is rotatable by one servomotor to set the wafer in its appropriate angular position ($\phi$ adjustment) and is shiftable by respective servomotors in the X and Y directions. Servomotor control is effected by optical means detecting a noncircular edge portion of the wafer as well as alignment marks on the wafer inwardly of the edge thereof.

5 Claims, 9 Drawing Figures

METHOD OF POSITIONING DISK-SHAPED WORKPIECES, PREFERABLY SEMICONDUCTOR WAFERS

CROSS REFERENCE TO RELATED APPLICATION

This application is a continuation-in-part of my copending application Ser. No. 188,539 filed Sept. 18, 1980 and now abandoned.

FIELD OF THE INVENTION

My present invention relates to a method of prepositioning planar workpieces, especially disk-shaped members such as semiconductor wafers, prior to transfer thereof to an exposure stage or for further processing. More particularly, the invention deals with the precise positioning of a semiconductor wafer with respect to a predetermined reference orientation, such as a fixed raster or grid, using optoelectronic techniques.

BACKGROUND OF THE INVENTION

In the production of semiconductor circuit elements, workpieces in the form of semiconductor wafers are generally coated with a photosensitive layer and are exposed by an appropriate optical system effecting image reduction in a pattern determined by a mask so that subsequent development and treatment may establish certain conductive or nonconductive paths on the wafer and/or from circuit elements thereon.

In many cases, circuit elements have already been formed on the wafer before such exposure so that during the exposure a precise positioning of the semiconductor wafer relative to the mask and hence to a reference position in the exposure system is essential for proper correlation of the several circuit arrays.

While the exposure station itself is generally provided with optoelectronic means for effecting the fine adjustment of the orientation of the wafer, e.g. with respect to alignment marks provided on the latter (see my copending application Ser. No. 197,991, filed Oct. 10, 1980, and Ser. No. 265,549, filed May 20, 1981), the field of such optoelectronic means is generally extremely limited so that the wafer must be fed to the exposure device with a predetermined orientation designed to ensure that the reference mark or indexing mark will lie within the window of operability of the adjustment means in the photoprinting stage.

This can be achieved, as pointed out in the aforementioned copending application, by providing a positioning stage ahead of the photoprinting stage at which a succession of wafers individually are prepositioned with respect to a reference position, e.g. a grid, and from which they are then transferred to the photoprinting stage.

Positioning stations of the type described, with which the present invention is concerned, are also important for other purposes although their primary utility is in imparting to a semiconductive wafer a predetermined orientation.

The exposure stage, at which the light for exposing the photosensitive layer is projected onto a photosensitive layer of the wafer, is generally provided for X-Y adjustability, i.e. is a table movable in two mutually orthogonal horizontal directions, one of which is referred to as the X-direction while the direction perpendicular thereto is referred to as the Y-direction.

In an earlier positioning device for such wafers, the preadjustment is effected exclusively by acting upon, or in response to, the position of the outer contour of the wafer. In other words, the outer contour of the wafer is positioned with respect to a fixed location on the device.

While this may not be a problem when the exposure system is designed to provide a pattern on the wafer which is subsequently the basis for further manufacturing processes, a problem is encountered if the wafer has previously been provided with circuit elements, for example, since the positions and orientations of these elements may not be precise relative to the outer contour. As a result, in spite of every effort to accurately position the wafer by use of its outer contour, the positions of elements on the wafer may be inexact and, indeed, sufficiently imprecise as to preclude using the exposure device subsequently.

OBJECTS OF THE INVENTION

It is the general object of the present invention to improve upon the principles originally set forth in my above-identified prior application.

Another object of the invention is to provide an improved method of positioning disk-shaped workpieces and especially semiconductive wafers particularly to enable them to be transferred effectively to an exposure stage.

SUMMARY OF THE INVENTION

These objects and others which will become apparent hereinafter are attained, in accordance with the present invention, by providing each wafer inwardly of its outer periphery but yet close to the edge thereof with at least one but preferably two spaced-apart alignment marks with respect to which an optoelectronic sensor is responsive and by providing the prepositioning station with a stage displaceable along X, Y and $\phi$ coordinates by respective servomotors responsive to the optoelectronic sensor.

The table or stage can be rotatable about an axis perpendicular to the X-Y plane and disposed at the origin of the X and Y coordinate system, e.g. by means of a worm and worm-wheel arrangement while the worm and other rotary members of the table can be mounted, in turn, on stacked table members or carriages shiftable respectively in the X and Y directions, i.e. two mutually perpendicular horizontal directions.

The system of the present invention can operate utilizing the principles of my prior application as well, e.g. by providing a magazine in which the semiconductive wafers (usually provided with photosensitive layers) are stored and from which the wafers can be withdrawn successively by a manipulator which transfers them to the prepositioning station and whereafter the wafers are transferred to the printing or exposure station. The manipulator and magazine of that application, which is hereby incorporated in its entirety into my instant application by reference, may be utilized in the present system as well.

One of the advantages of the system of the present invention is that upon transfer of the wafer to the exposure station in its orientation as established in the prepositioning station, any additional adjustment which is required for exposure can be effected exclusively by X-Y adjustment. Yet another advantage of this system is that any required angular adjustment of the exposure mask (see the aforementioned prior application) can be of extremely small magnitude.

BRIEF DESCRIPTION OF THE DRAWING

The above and other features of the present invention will become more readily apparent from the following description, reference being made to the accompanying drawing in which.

SPECIFIC DESCRIPTION

Figure 1:
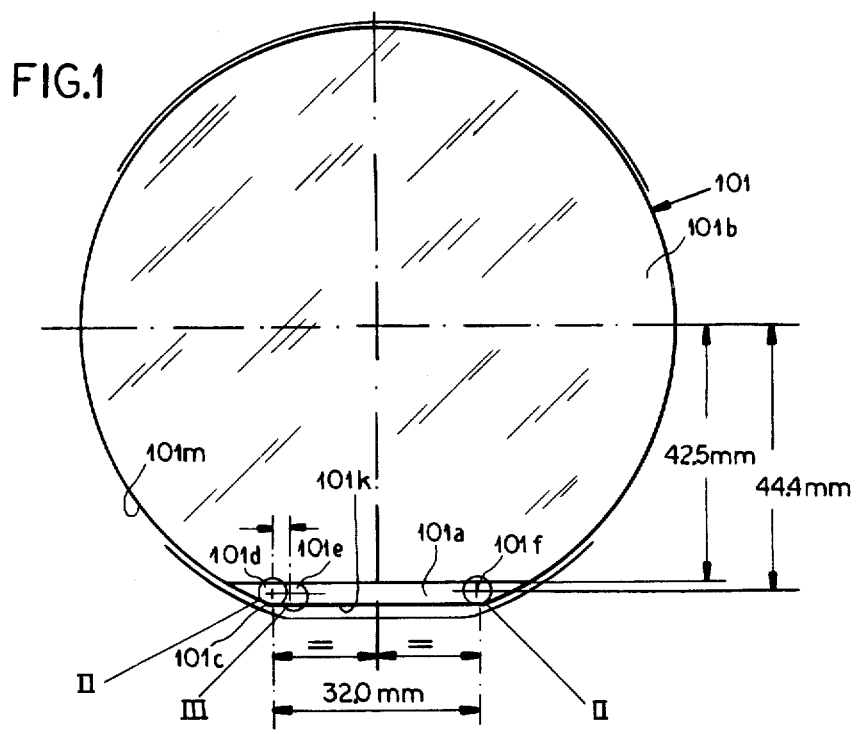
FIG. 1 is a plan view of a wafer, according to the invention, which can be photoexposed in accordance with a pattern determined by a mask.
Figure 2:
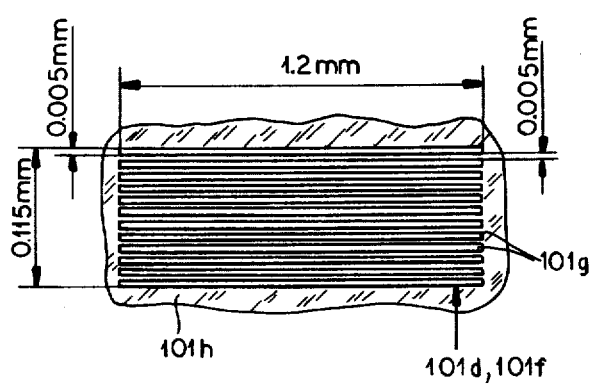
FIG. 2 is an elevational view, greatly enlarged, of the regions II of the wafer of FIG. 1.
Figure 3:
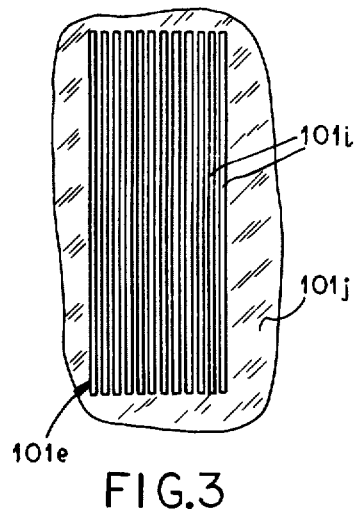
FIG. 3 is a greatly enlarged view of the region III of the wafer of FIG. 1.

FIGS. 1 through 3 illustrate a wafer of the type which can serve as a workpiece according to the present invention. The wafer 101 comprises a silicon disk 101a of the dimensions, given in millimeters, shown in the drawing and provided over substantially its entire surface with a layer 101b photosensitive material which can be exposed for generating patterns, e.g. of conductors, upon this semiconductive wafer which can be assumed to have been previously treated to form circuit elements by electron-beam technology or previous photoexposure treatments.

In an edge portion 101c of the wafer, which is translucent, there are provided alignment marks 101d, 101e and 101f which have been shown in greater detail in FIGS. 2 and 3. The alignment marks 101d and 101f are each constituted by narrow translucent strips 101g in a dark or opaque field 101h, the strips extending in the Y-direction of adjustment. Also shown is a straight edge 101k of the wafer extending along a chord of its otherwise circular outline.

The mark 101e shown in FIG. 3 comprises an array of narrow translucent strips 101i extending in the X-direction of adjustment, i.e. perpendicular to the strips 101g, and also in a dark or opaque field 101j. The marks 101d–101f may be applied at the same time as any previous circuit elements are applied to the wafer so that the positions of these marks are precisely coordinated with the positions of those circuit elements and the marks can serve to enable the wafer to be lined up for precise exposure of a mask pattern relative to preexisting circuit elements.

Figure 4:
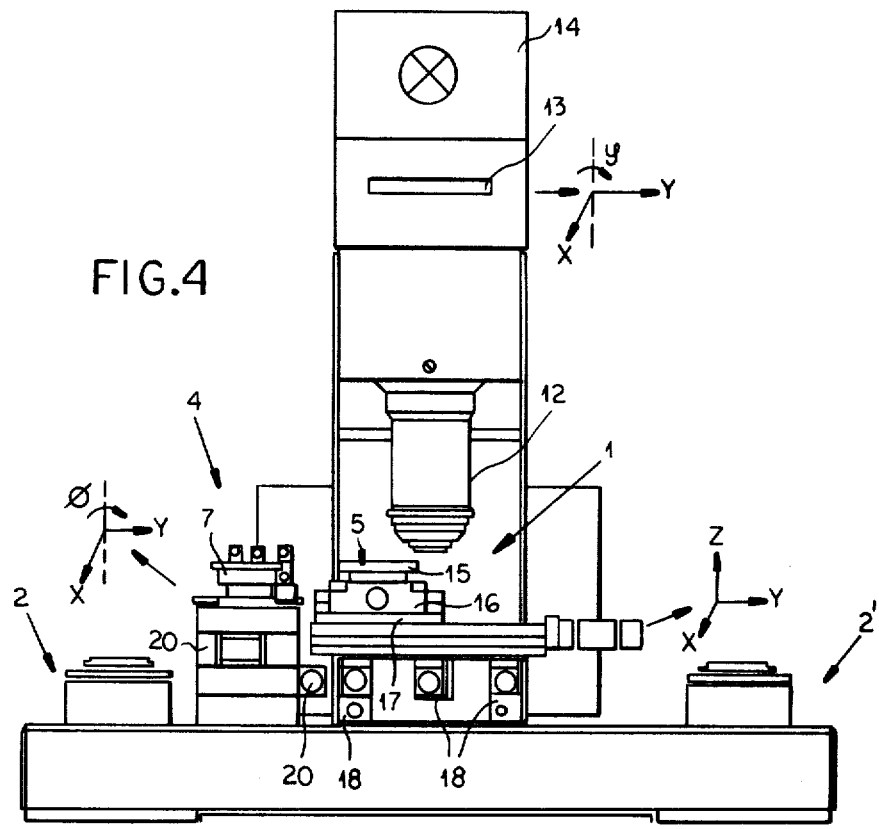
FIG. 4 is a vertical elevational view diagrammatically illustrating an apparatus according to the present invention for printing the patterns of a mask, greatly reduced in size, by the step-and-repeat method on wafers of the type shown in FIGS. 1 through 3, this view omitting a manipulator arm shown in FIGS. 5 and 6 so that other parts can be seen more clearly.
Figure 5:
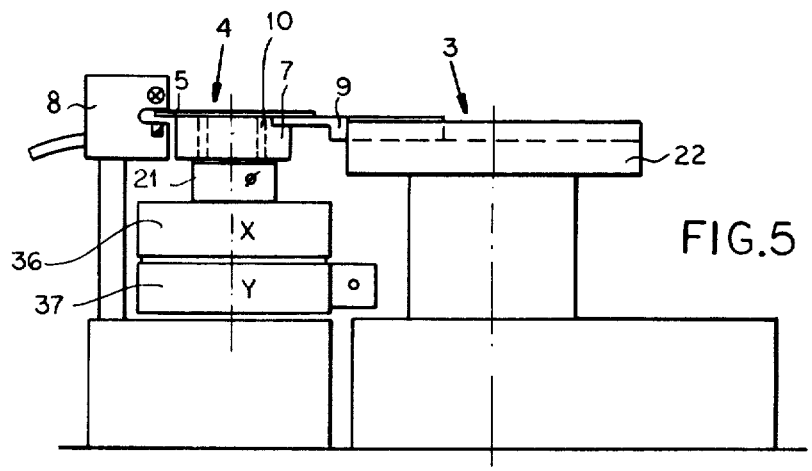
FIG. 5 is an elevational view of a prepositioning station shown in greater detail in FIGS. 7 and 8 and diagrammatically illustrating an aspect of the invention, i.e. how the prepositioning station can cooperate with the exposure or printing station.
Figure 6:
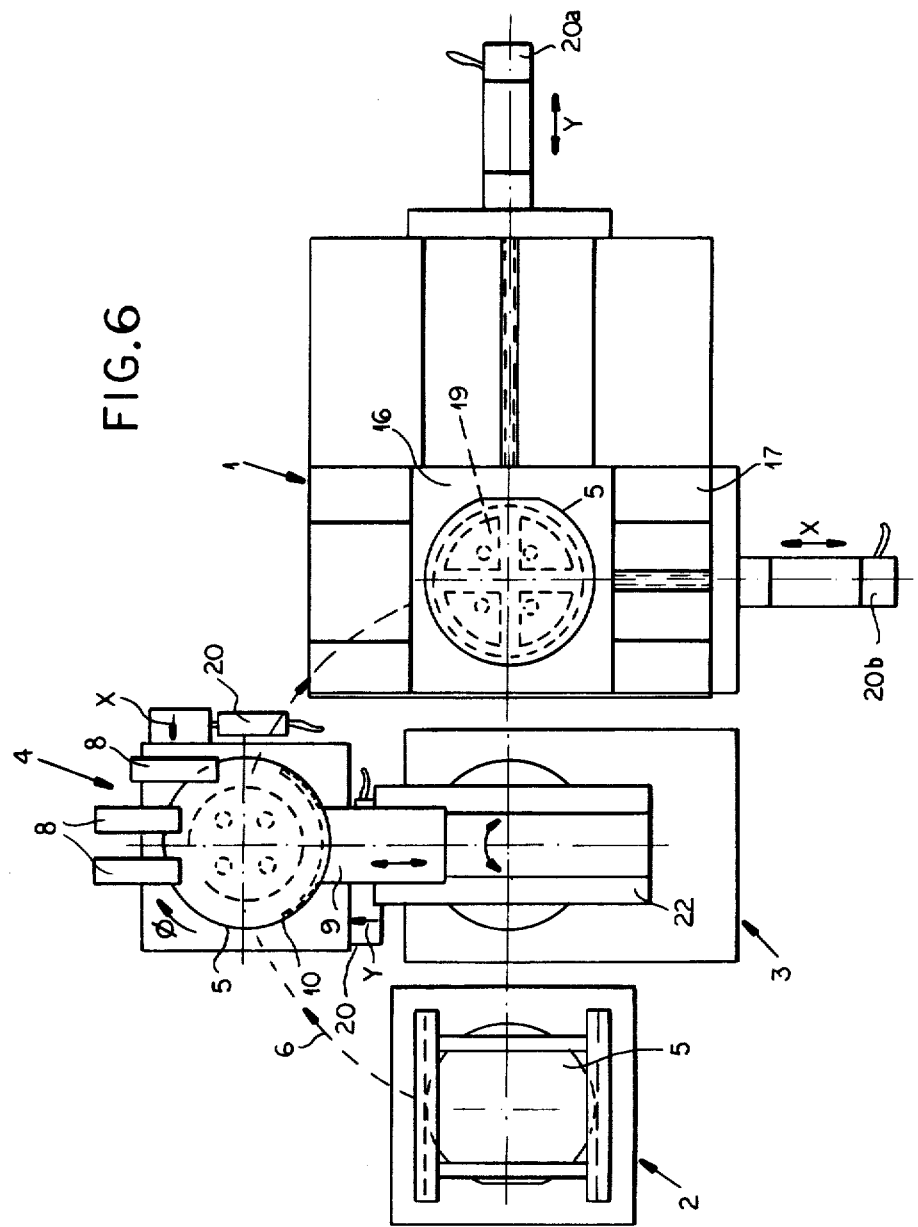
FIG. 6 is a plan view of the system of FIG. 4.

FIGS. 4 through 6 show the overall arrangement of an apparatus for exposing such wafers, the apparatus comprising at least one magazine 2 in which the wafers, previously provided with unexposed photosensitive layers, are stacked and from which the wafers can be successively removed by a manipulator 3 and sent to a prepositioning station 4.

The details of the latter, as far as they involve the actual manipulation of the wafer to position it in accordance with a fixed reference such as a raster or grid, have been illustrated in FIGS. 7 and 8 and will be described in connection with these FIGURES.

At this point it is sufficient to note that, in the manipulator, the wafer is positioned with respect to the reference to the X and Y directions and angularly as represented by the arrow $\phi$. The angular displacement $\phi$ of the wafer in its plane and hence in the Y plane, naturally is effected about an axis parallel to the Z coordinate axis.

Thereafter, the oriented and positioned wafer is shifted into the printing station 1 and disposed and chucked on a stage 15 on which it is held by the application of suction from below.

The stage 15 is mounted on two carriages 16 and 17 movable in the X and Y coordinate directions, respectively, and also displaceable in the Z coordinate direction, i.e. vertically, by respective stepping motors 18.

An optical system is mounted above the stage 15 to project an image, reduced in size 10:1, from a mask 13 onto the wafer. The exposure optics and an associated light source are represented by a projection lens 12 and a lamp assembly 14.

The exposure is carried out by the step-and-repeat method, i.e. the image of the mask is focused on a part of the wafer which is exposed, whereupon the wafer is stepped through a predetermined increment in the X and/or Y direction and exposure is repeated until the entire wafer has been swept by the exposure sequence.

The means for stepping the stage 15 and triggering the exposure are conventional in the art and have not been illustrated in detail.

After the exposure is complete, the exposed wafer is transferred to and stored in a magazine 2'.

As can be seen from FIG. 5, the manipulator 3 has a pivoting arm 22 carrying a radially shiftable fork-shaped retaining member 9 which can engage beneath the wafer and is provided with suction holes 10 at which reduced pressure is generated to grip the wafer.

In the prepositioning station 4, moreover, a stage or table 7 is provided with holes at which suction is generated so that the wafer can be retained when it is not about to be transferred by the arm 22.

The stage 7 is rotatable, by means generally represented at 21 and including a motor, about the vertical axis to effect the angular displacement $\phi$. The table 7 is also carried upon a pair of stacked carriages 36, 37 shiftable in the X and Y directions. The sensor assembly for the positioning of the wafer is represented generally at 8 and, as will be described in greater detail hereinafter, controls the means for effecting X, Y and $\phi$ displacement.

In FIG. 6 it can be seen that the manipulator 3 withdraws an unexposed wafer 5, one of the type shown at 101 in FIGS. 1 through 3, from the magazine 2 and disposes it on the stage or table 7 of the prepositioning station 4.

This table 7 is then displaced in the X, Y and φ directions until the wafer is in a predetermined position relative to a stationary system of coordinates.

Whereas in the system of my prior application the sensors responded to the chordal edge 101k and its relationship to the arcuate periphery 101m of the wafer, the system of the instant invention can utilize at least in part a detection of the reference marks 101d through 101f.

After this coarse adjustment, a crescent-shaped member 9 of arm 22 engages the wafer from beneath and shifts it into the printing station 1 where the wafer is disposed on stage 15 and held by reduced pressure. The wafer is thus in a position in which the reference marks 101d through 101f lie within the field of view or capture region of the optoelectronic means controlling the fine alignment whereupon exposure can be carried out in the manner described and in a stepwise operation utilizing the stepping motors 18. The means for fine alignment in the printing station has not been disclosed in detail since it is not the subject matter of this invention although similar means can be used as are employed for the positioning of the wafers at station 4.

During this fine alignment and the subsequent exposure process, the manipulator 3 can carry a further wafer onto table 7 and is prepared to remove a wafer from the printing station to carry it into the magazine 2'.

Figure 7:
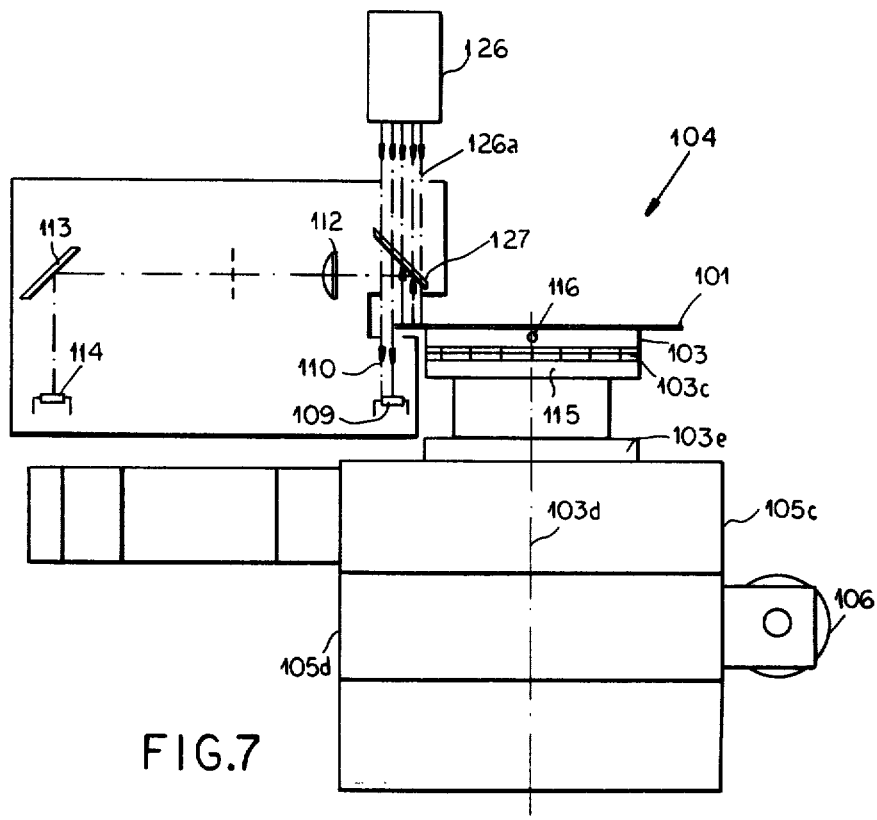
FIG. 7 is an elevational view of the prepositioning station according to the instant invention.
Figure 8:
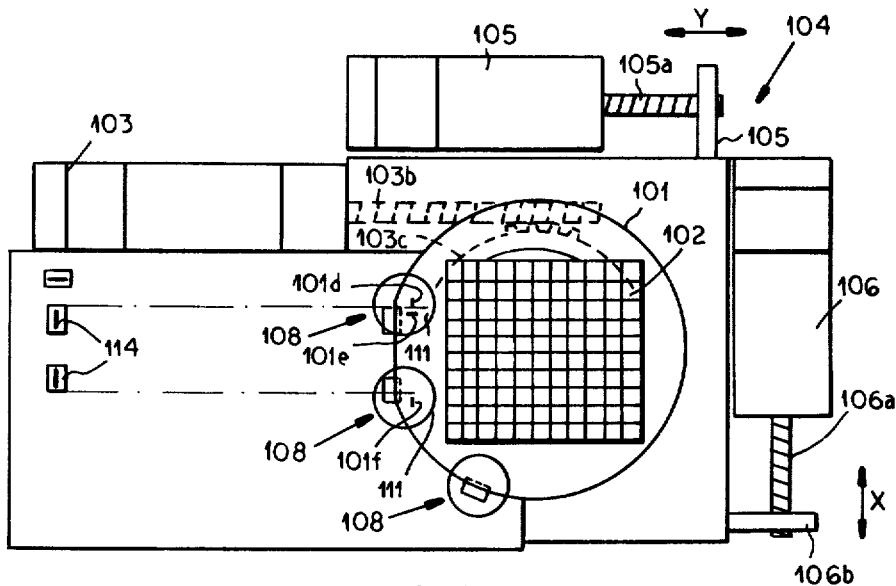
FIG. 8 is a plan view thereof.

The prepositioning station 104 shown in FIGS. 7 and 8 can, of course, be used as the station 4 previously described.

The wafer 101 bearing a pattern 102 is carried by a swinging arm onto the suction chuck or table 103 which is rotated by a servomotor 103a whose worm 103b meshes with a worm wheel 103c coupled with the chuck 103 so that the latter can be rotated about the axis 103d through the angle φ referred to above.

The chuck is journaled on a carriage 103e which can be shifted by a leadscrew 105a driven by a servomotor 105 and threaded into an arm 105b connected to the carriage. The carriage can move on rails on a table 105c which is guided on tracks (not shown) on a further table 105d so that another leadscrew 106a driven by a motor 106 and threaded into a bracket 106b can displace this member 105c. Thus the motors 105 and 106 define the X and Y directions of displacement.

The sensor system comprises three optical units, represented generally at 108, and which can cooperate with marks on the wafer or with the edges previously mentioned. For the purposes of this description, the sensors will be understood to cooperate with the chordal and arcuate edges of the wafer.

Each optical system comprises a light source 126 directing a columnar beam 126a of light downwardly through a semitransparent mirror 127 across the edge of the wafer 101 which overhangs the chuck 103, and toward a photodiode 109 therebelow.

The photodiode does not collect the portion of the light beam which is obstructed by the edge of the wafer so that the electrical output of the photodiode is a function of the degree to which it is overhung by the wafer edge. The portion of the beam which does impinge upon the photodiode is represented at 110 while the beam portion intercepted by the wafer has been designated 111.

The electrical output is registered by conventional circuitry while a full rotation is imparted to the chuck 103, i.e. a command signal is given to the motor 103a to rotate the chuck for an entire revolution or until the wafer is in the appropriate angular position as determined by the fact that all three photodiodes 109 are shielded to the predetermined desired extent.

In these positions, the beam portions 111 are also trained upon the marks 101d, 101e and 101f which are used for the more exact positioning. The images of these marks are transmitted by the semireflective mirror 127 through a condensing or objective lens 112 and a mirror 113 to respective differential photodiodes 114 which control the motors 105, 106, and if necessary the motor 103a, for more precise positioning of the wafer.

The principle of this diode-controlled adjustment will be described in connection with FIG. 9.

The wafer 101 is displaced in the directions of the X, Y and φ coordinates until it has been properly positioned and is then transferred to the orthogonally shiftable projection table, the marks 101d through 101f being utilized for fine positioning in the projection station.

A Peltier-effect heating and cooling device 115 is provided to control the temperature of the table 103 in response to a temperature sensor 116 so that the temperature of the wafer and of the table will be the same as the temperature of the table upon which the wafer is subsequently placed, i.e. the stage 15 of exposure station 1.

Figure 9:
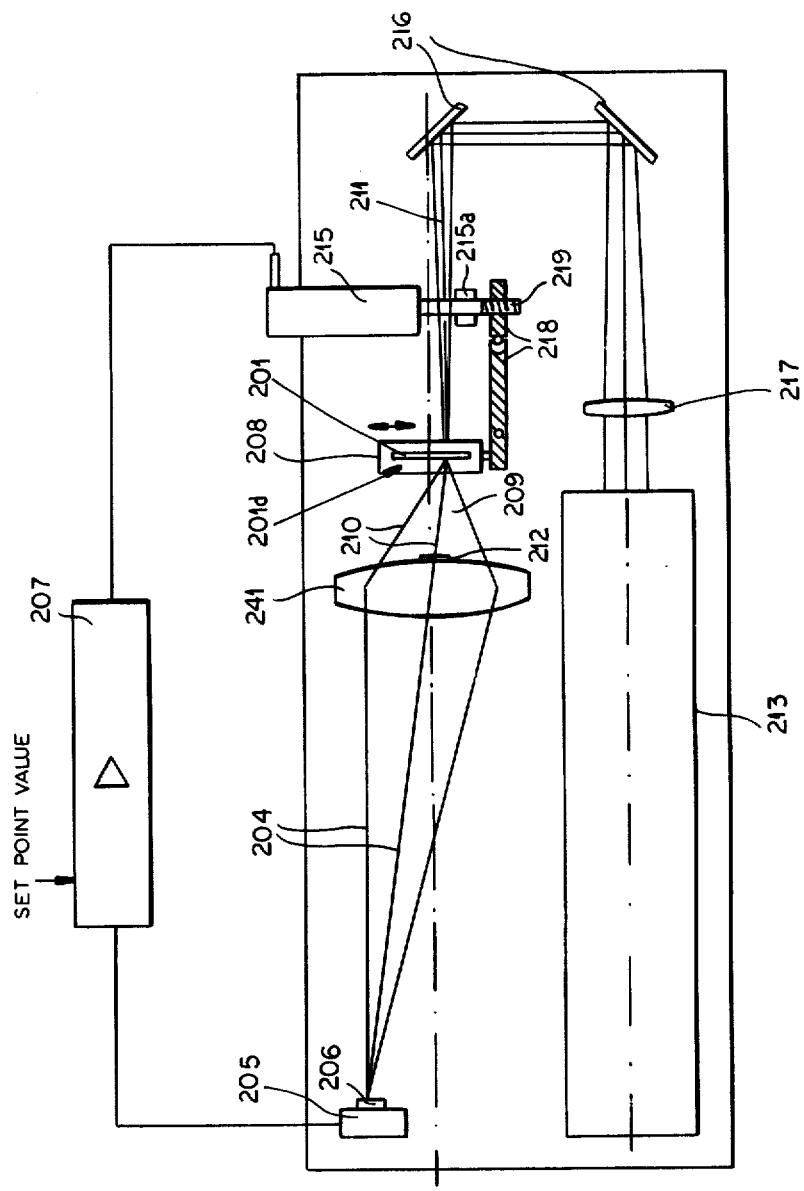
FIG. 9 is a diagram illustrating the operation of an optoelectronic means for adjusting the position of a workpiece in a station such as that of FIGS. 7 and 8.

FIG. 9 has been presented to show the principles of differential diode adjustment of the type used in the system according to my present invention.

The optical source is a laser 213 which projects its coherent light bundle through a collective lens 217 focusing it upon one of two marks 201d of a wafer 201 which here, for convenience of explanation and illustration, is being shown to be vertically positioned. The coherent light beam 211 is trained on the marks by mirrors 216 which can represent any means for directing the beam onto the marks.

In the region of the marks, the wafer can be translucent so that transmitted light is utilized for positioning. However, as in the embodiment of FIGS. 7 and 8, light reflected from the marks will also serve.

The wafer is held in a device which is here represented at 208 and can be displaced via a linkage 218 by a motor 215 and a leadscrew 215a.

The transmitted (or reflected) light from the marks is collected by an optical system represented by a collecting lens 241 and focused as a beam 204 onto a differential photodiode 206.

The laser light bundle trained upon the marks 201d and focused onto the surface of the collecting lens 241 is absorbed by a shield 212. Thus only the portions of the beam diffracted by the marks 201d are projected onto the diode 206.

As previously noted, the marks 201d, etc., are in the form of a light-scattering open structure.

Since the light scattered by the marks is collected and focused upon the photoelectronic element 206, a comparatively sharp image of the mark can be formed thereon and the total received light will be a function of the position of the wafer. An amplifier 205 feeds the signal to a comparator 207 which also receives a set-point value establishing the precise position of the wafer, the difference signal being an electrical output proportional to the deviation between the actual position and the set-point position. This difference signal is supplied to the motor 215 to properly shift the wafer.

It will be understood that a system analogous to that shown in FIG. 9, whether using translumination as in this instance or reflected light as is the case in the embodiment illustrated in FIGS. 7 and 8, can be used to control each of the servomotors 103a, 105, 106.

I claim:

1. A method for preparing a semiconductor wafer for the formation of a pattern of circuit elements at predetermined locations on a surface thereof by selective illumination of a photosensitive layer on such surface through a mask in an exposure station after orthogonal and angular prealignment of the wafer in a prepositioning station, comprising the steps of:
(a) providing the wafer with a peripheral edge having a distinctive portion and with optical surface markings inwardly from said edge;
(b) coarsely prealigning the wafer in the prepositioning station by optical detection of said distinctive edge portion and of certain of said surface markings;
(c) transferring the wafer to the exposure station with the orientation imparted thereto in the prepositioning station; and
(d) more precisely adjusting the wafer in said exposure station by optically detecting other of said surface markings.

2. The method defined in claim 1 wherein said certain of said surface markings include light-scattering formations on a contrasting area.

3. The method defined in claim 2 wherein said contrasting area is light-transmissive and is transluminated by a position-detecting beam.

4. The method defined in claim 1, 2 or 3 wherein light is directed upon said certain of said surface markings from a laser.

5. The method defined in claim 1, 2 or 3 wherein said certain of said surface markings include two sets of closely spaced parallel lines at spaced-apart locations, the lines of one set being perpendicular to those of the other set.

* * * * *